United States Patent
Shimada

(10) Patent No.: US 9,910,274 B2
(45) Date of Patent: Mar. 6, 2018

(54) DRIVING METHOD FOR VIBRATION BODY, VIBRATION DRIVING DEVICE, AND IMAGE PICKUP APPARATUS

(71) Applicant: CANON KABUSHIKI KAISHA, Tokyo (JP)

(72) Inventor: Akira Shimada, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 69 days.

(21) Appl. No.: 15/049,513

(22) Filed: Feb. 22, 2016

(65) Prior Publication Data
US 2016/0246052 A1   Aug. 25, 2016

(30) Foreign Application Priority Data

Feb. 25, 2015 (JP) ................. 2015-035106

(51) Int. Cl.
| | |
|---|---|
| G02B 27/00 | (2006.01) |
| H01L 41/04 | (2006.01) |
| H04N 5/217 | (2011.01) |
| H02N 2/06 | (2006.01) |
| H02N 2/08 | (2006.01) |

(Continued)

(52) U.S. Cl.
CPC ........... *G02B 27/0006* (2013.01); *G02B 7/08* (2013.01); *H01L 41/042* (2013.01); *H02N 2/06* (2013.01); *H02N 2/08* (2013.01); *H04N 5/2171* (2013.01)

(58) Field of Classification Search
None
See application file for complete search history.

(56) References Cited

U.S. PATENT DOCUMENTS

| | | |
|---|---|---|
| 7,576,474 B2 | 8/2009 | Koc et al. |
| 8,256,905 B2 | 9/2012 | Ohashi |
| 9,154,056 B2 | 10/2015 | Suefuji et al. |

(Continued)

FOREIGN PATENT DOCUMENTS

| | | |
|---|---|---|
| CN | 101166006 A | 4/2008 |
| CN | 102365814 A | 2/2012 |

(Continued)

OTHER PUBLICATIONS

Office Action dated Jan. 5, 2018, in Chinese Patent Application No. 201610103925.8.

*Primary Examiner* — WB Perkey
(74) *Attorney, Agent, or Firm* — Fitzpatrick, Cella, Harper & Scinto

(57) ABSTRACT

A vibration driving device that is capable of exciting a vibration of desired amplitude with a low voltage. A vibration body has a plate-like elastic body and an electro-mechanical energy conversion element that is joined to the elastic body. A control unit excites a vibration in a first vibration mode and a vibration in a second vibration mode in the vibration body by applying alternation voltages to the electro-mechanical energy conversion element. Orders or numbers of nodes of the vibrations in the first and second modes in a first direction that intersects perpendicularly with a thickness direction of the elastic body are mutually different by one. And orders or numbers of nodes of the vibrations in the first and second modes in a second direction that intersects perpendicularly with the thickness direction of the elastic body and the first direction are mutually different by one.

11 Claims, 9 Drawing Sheets

(51) Int. Cl.
  *G02B 7/00* (2006.01)
  *G02B 7/08* (2006.01)

(56) References Cited

U.S. PATENT DOCUMENTS

| | | | |
|---|---|---|---|
| 2010/0201225 | A1 | 8/2010 | Morioke |
| 2011/0298400 | A1* | 12/2011 | Kudo .................. H02N 2/0015 318/116 |
| 2012/0120307 | A1* | 5/2012 | Shimada .................. B08B 7/02 348/373 |
| 2012/0200922 | A1* | 8/2012 | Urakami .................. B08B 7/02 359/513 |
| 2012/0274243 | A1* | 11/2012 | Sumioka .............. H04N 5/2171 318/116 |
| 2013/0271639 | A1* | 10/2013 | Komada .............. H04N 5/2171 348/335 |
| 2014/0009830 | A1* | 1/2014 | Ohashi ...................... B08B 7/02 359/507 |
| 2016/0246052 | A1* | 8/2016 | Shimada ............ G02B 27/0006 |

FOREIGN PATENT DOCUMENTS

| | | |
|---|---|---|
| CN | 102611350 A | 7/2012 |
| JP | 2625555 B2 | 7/1997 |
| JP | 2003-319222 A | 11/2003 |
| JP | 2008-207170 A | 9/2008 |

* cited by examiner

DRIVING METHOD FOR VIBRATION BODY, VIBRATION DRIVING DEVICE, AND IMAGE PICKUP APPARATUS

BACKGROUND OF THE INVENTION

Field of the Invention

The present invention relates to a technique that excites a vibration on an elastic body so as to remove dust, etc., adhered to the elastic body or so as to relatively move the elastic body and a driven body by contacting the elastic body to the driven body, for example.

Description of the Related Art

An image pickup apparatus, such as a digital camera, receives an imaging light flux with an image pickup device, such as a CCD sensor and a CMOS sensor, converts an electrical signal output from the image pickup device into image data, and stores the image data into a storage medium, such as a memory card. Such an image pickup apparatus generally has an optical low pass filter and an infrared absorption filter arranged at an object side of the image pickup device. Accordingly, when dust, etc., adheres to front faces of these filters, dust-adhered parts are projected as black points in a photographed image, which deteriorate the appearance of the image.

Moreover, since a digital single-lens reflex camera with an interchangeable lens, which is an example of an image pickup apparatus, has mechanical operation units, such as a shutter and a quick return mirror, arranged near an image pickup device, dust, etc., generated in the mechanical operation units may adhere to surfaces of the image pickup device or a filter. Furthermore, the digital single-lens reflex camera may allow dust, etc., to enter into a camera body through an opening of a lens mount at the time of lens exchange, and the dust, etc., may adhere to the surfaces of the image pickup device or the filter.

In order to solve such a problem, there is a proposed technique that disposes a dustproof curtain that allows a photographing light flux to transmit at an object side of an image pickup device, and that removes dust, etc., adhered to the surface of the dustproof curtain by vibrating the dustproof curtain with a piezoelectric device (see Japanese Laid-Open Patent Publication (Kokai) No. 2003-319222 (JP 2003-319222A)). Moreover, a dust removing device that moves dust adhered to an optical element in a desired direction by generating an elliptic motion to a vibration body attached to the optical element is proposed as an apparatus that removes dust, etc., using a vibration (see Japanese Laid-Open Patent Publication (Kokai) No. 2008-207170 (JP 2008-207170A)).

FIG. 10 is a perspective view schematically showing a configuration of a conventional dust removing device disclosed in JP 2008-207170A. A vibration body 103 is constituted by attaching piezoelectric devices 121 and 122 to a transparent optical element 101. Piezoelectric devices 121 and 122 are arranged at different positions in a direction in which nodes of an out-of-plane flexural vibration line up in a vibration body 103. The vibration body 103 will be attached to a front side (an imaging plane side of an imaging light flux) of an image pickup device 104.

Alternation voltages of which vibration periods are identical and time-related phases differ in 90 degrees are respectively applied to the piezoelectric devices 121 and 122. A frequency of the alternation voltages applied is determined within a range between a resonance frequency of an m-th out-of-plane flexural vibration (m is a natural number) that deforms out of plane along a longitudinal direction of the vibration body 103 and a resonance frequency of an (m+1)th out-of-plane flexural vibration, and so that an amplitude ratio of two vibrations becomes "1:1". The (m+1)th out-of-plane flexural vibration that has the phase difference of 90 degrees with respect to the m-th out-of-plane flexural vibration (the phase progresses in 90 degrees to the m-th out-of-plane flexural vibration) is excited in the vibration body 103 with the same amplitude and the same vibration period as the m-th out-of-plane flexural vibration.

An elliptic motion occurs in the vibration body 103 by compositing these two vibrations. When dust is pushed up by this elliptic motion out of the surface, the dust moves in a predetermined direction with being flipped by receiving a force in a normal direction of the surface of the vibration body 103.

However, since the vibration body 103 in FIG. 10 is driven at the frequency between the resonance frequencies of two vibration modes, a vibration amplitude will become small as compared with a case where it is driven at a frequency near a resonance frequency. Accordingly, it is necessary to enlarge the drive voltage in order to obtain a vibration amplitude required to move dust, etc.

Moreover, since the vibration body 103 has many vibration modes, unnecessary vibration modes other than the desired two vibration modes are mixed. The mixture of the unnecessary vibration modes generates a spot where an in-plane direction at the time of pushing up the dust on the surface of the optical element 101 outside is opposite to the desired direction and a spot where a component in the in-plane direction becomes small.

In these spots, the dust cannot be moved in the desired direction, or efficiency to move dust deteriorates because a force to move the dust becomes smaller than adhesion of the dust. Moreover, since two or more piezoelectric devices are needed on the optical element 101 in order to excite vibrations in two vibration modes with a desired phase difference, a miniaturization is not easy.

SUMMARY OF THE INVENTION

The present invention provides a driving method for a vibration body that is capable of exciting a vibration of desired amplitude with a low voltage. Moreover, the present invention provides a vibration driving device equipped with a vibration body that is easy to miniaturize.

Accordingly, a first aspect of the present invention provides a vibration driving device including a vibration body configured to have a plate-like elastic body and a first electro-mechanical energy conversion element that is joined to the elastic body, and a control unit configured to excite a vibration in a first vibration mode and a vibration in a second vibration mode in the vibration body by applying alternation voltages to the first electro-mechanical energy conversion element, orders or numbers of nodes of the vibrations in the first and second modes in a first direction that intersects perpendicularly with a thickness direction of the elastic body being mutually different by one, and orders or numbers of nodes of the vibrations in the first and second modes in a second direction that intersects perpendicularly with the thickness direction of the elastic body and the first direction being mutually different by one.

Accordingly, a second aspect of the present invention provides a driving method for a vibration body having a plate-like elastic body and an electro-mechanical energy conversion element that is joined to the elastic body, the driving method including a step of exciting a vibration in a first vibration mode and a vibration in a second vibration mode in the vibration body by applying alternation voltages to the electro-mechanical energy conversion element, orders or numbers of nodes of the vibrations in the first and second modes in a first direction that intersects perpendicularly with a thickness direction of the elastic body being mutually different by one, and orders or numbers of the nodes of the vibrations in the first and second modes in a second direction that intersects perpendicularly with the thickness direction of the elastic body and the first direction being mutually different by one.

Accordingly, a third aspect of the present invention provides an image pickup apparatus including a lens barrel in which a lens group is arranged, and a vibration driving device that moves the lens group in an optical axis direction of the lens barrel. The vibration driving device includes a vibration body that has a plate-like elastic body and an electro-mechanical energy conversion element that is joined to the elastic body, a driven body that is frictionally driven by vibrations excited in the vibration body, and a control unit configured to excite a vibration in a first vibration mode and a vibration in a second vibration mode in the vibration body by applying alternation voltages to the electro-mechanical energy conversion element, orders or numbers of nodes of the vibrations in the first and second modes in a first direction that intersects perpendicularly with a thickness direction of the elastic body being mutually different by one, and orders or numbers of the nodes of the vibrations in the first and second modes in a second direction that intersects perpendicularly with the thickness direction of the elastic body and the first direction being mutually different by one. The lens group moves in the optical axis direction according to relative movement of the vibration body and the driven body that occurs by exciting the vibration in the first vibration mode and the vibration in the second vibration mode in the vibration body.

Accordingly, a fourth aspect of the present invention provides An image pickup apparatus including an image pickup device, and a dust removing device. The dust removing device includes a vibration body that has a plate-like optical element arranged in front of the image pickup device, and an electro-mechanical energy conversion element joined to a first side of the optical element, and a control unit configured to excite a vibration in a first vibration mode and a vibration in a second vibration mode in the vibration body by applying alternation voltages to the electro-mechanical energy conversion element in order to remove dust adhered on a front side of the optical element, orders or numbers of nodes of the vibrations in the first and second modes in a first direction that intersects perpendicularly with a thickness direction of the optical element being mutually different by one, and orders or numbers of nodes of the vibrations in the first and second modes in a second direction that intersects perpendicularly with the thickness direction of the optical element and the first direction being mutually different by one. The node positions in the second vibration mode are positioned outside an area through which a light flux that forms an image on the image pickup device transmits.

The present invention enables the driving using the resonance phenomena (driving at a frequency near the resonance frequency) by making natural vibrations in two vibration modes excited in the vibration body coincide approximately, which reduces influence of unnecessary vibration modes. Since this enables excitation of a vibration of large amplitude with a low voltage in the vibration body, an image pickup apparatus provided with a dust removing device that removes dust efficiently is achievable, for example. Moreover, the present invention enables excitation of vibrations in a plurality of vibration modes desired in the vibration body with a single electro-mechanical energy conversion element. Accordingly, since the vibration driving device equipped with the vibration body according to the present invention saves a space and simplifies the configuration for power supply, a miniaturization and a cost reduction become possible.

Further features of the present invention will become apparent from the following description of exemplary embodiments with reference to the attached drawings.

DESCRIPTION OF THE EMBODIMENTS

Hereafter, embodiments according to the present invention will be described in detail with reference to the drawings.

A first embodiment of the present invention will be described. In the first embodiment, a vibration driving device according to the embodiment of the present invention is applied to a drive source of a dust removing device that removes particles (dust, etc.) that are adhered to an optical element arranged in an optical path of an imaging light flux in an image pickup apparatus.

Figure 1A:
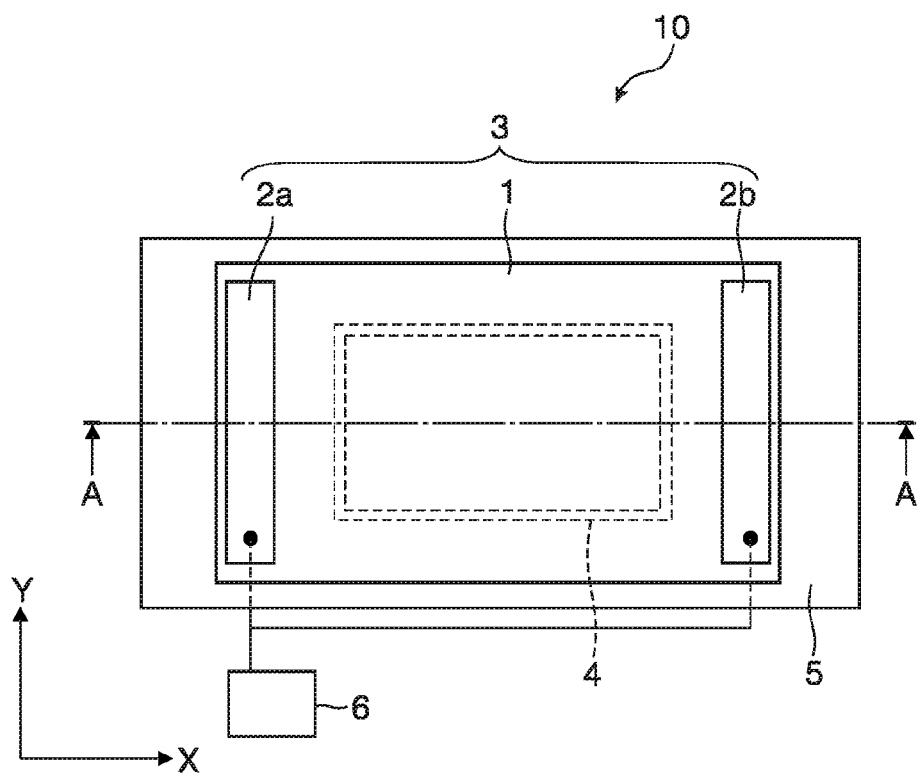
FIG. 1A is a plan view schematically showing a configuration of a dust removing device according to a first embodiment of the present invention.
Figure 1B:
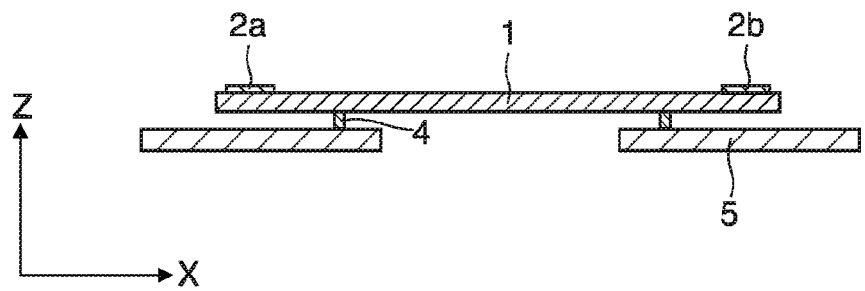
FIG. 1B is a sectional view showing the configuration taken along the line A-A in FIG. 1A.

FIG. 1A is a plan view showing a configuration of the dust removing device 10 according to the embodiment of the present invention, and FIG. 1B is a sectional view showing the configuration taken along the line A-A in FIG. 1A. It should be noted that a three-dimensional rectangular coordinate (an X-direction, a Y-direction, a Z-direction) is defined as shown in FIG. 1A and FIG. 1B. The dust removing device 10 is provided with an optical element 1 that is a plate-like elastic body, piezoelectric devices 2a, 2b that are electro-mechanical energy conversion elements, a support member 4, a holding member 5 that is attached to an image pickup device (not shown), and a control circuit 6.

The optical element 1 is a transparent element, such as a cover glass, an infrared ray cut filter, or an optical low pass filter, and light passing through the optical element 1 enters into the image pickup device (not shown). In this embodiment, the optical element 1 is made into a rectangular shape so as to match with a rectangular image pickup surface of a general image pickup device used in an image pickup apparatus like a digital camera. A longitudinal direction of the optical element 1 is the X-direction, a short-length direction is the Y-direction, and a thickness direction is the Z-direction.

The piezoelectric devices 2a and 2b are joined to a front side (a first side) of the optical element 1 with adhesive, etc., at a predetermined interval. A vibration body 3 is constituted by the optical element 1 and the piezoelectric devices 2a and 2b. In this embodiment, the direction of the interval of the piezoelectric devices 2a and 2b matches with the longitudinal direction (X-direction) of the optical element 1.

A back side (a second side opposite to the first side) of the optical element 1 is adhered and fixed to the holding member 5 by the frame-like support member 4. The support member 4 forms a sealed space between the holding member 5 and the optical element 1. Dust, etc., cannot invade into this sealed space from the exterior. It should be noted that the support member 4 is also made into a rectangular frame shape so as to match with the rectangular image pickup surface of the general image pickup device. The optical element 1 is positioned with respect to the holding member 5 by the support member 4 so that an imaging light flux passing through a predetermined region of the optical element 1 within a rectangular frame of the support member 4 forms an image onto the image pickup device.

The control circuit 6 applies an alternation voltage Va to the piezoelectric device 2a, and applies an alternation voltage Vb to the piezoelectric device 2b. It should be noted that a vibration driving device is constituted by the vibration body 3 and the control circuit 6.

When the alternation voltages Va and Vb are respectively applied to the piezoelectric devices 2a and 2b, the piezoelectric devices 2a and 2b expand and contract in an in-plane direction according to an inverse piezoelectric effect. Accordingly, the optical element 1 joined to the piezoelectric devices 2a and 2b receives a force that expands and contracts a joined surface (the first side) in the in-plane direction from the piezoelectric devices 2a and 2b. The force generates a vibration so that a concave portion and a convex portion on the joined surface are periodically switched. The dust removing device 10 excites vibrations in first and second vibration modes in each of the X-direction that is a traveling direction of a traveling wave and the Y-direction that intersects perpendicularly with the X-direction and the Z-direction. Hereinafter, the first vibration mode is called a vibration mode A, and the second vibration mode is called a vibration mode B.

Figure 2A:
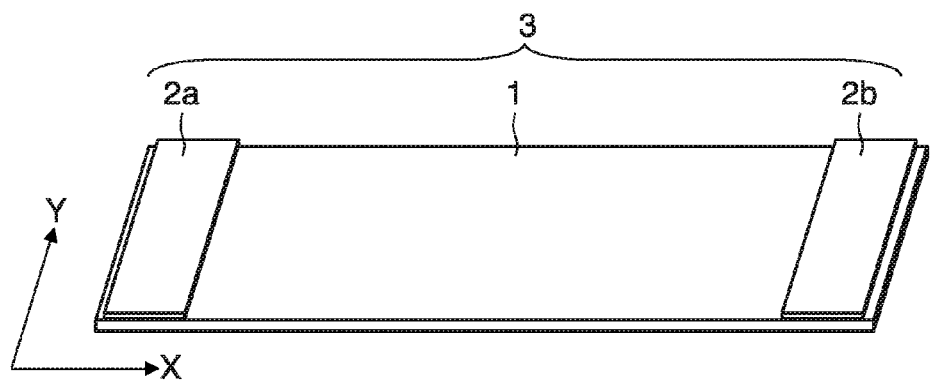
FIG. 2A is a perspective view showing a vibration body that constitutes the dust removing device in FIG. 1.
Figure 2B:
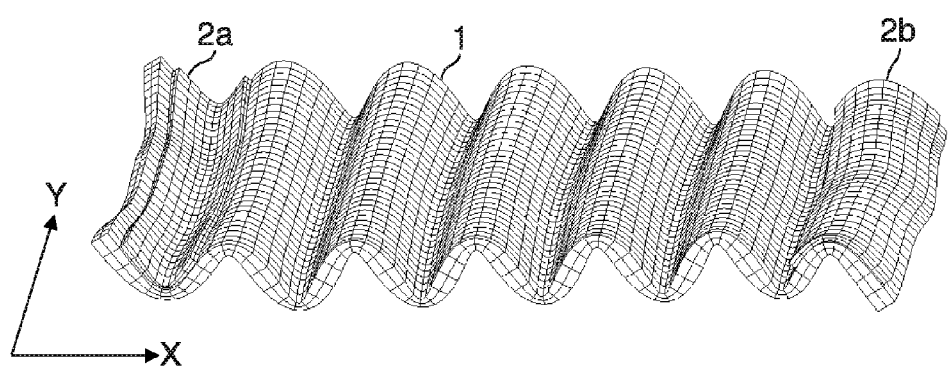
FIG. 2B and FIG. 2C are perspective views schematically showing vibrations in vibration modes A and B excited in the vibration body, respectively.
Figure 2C:
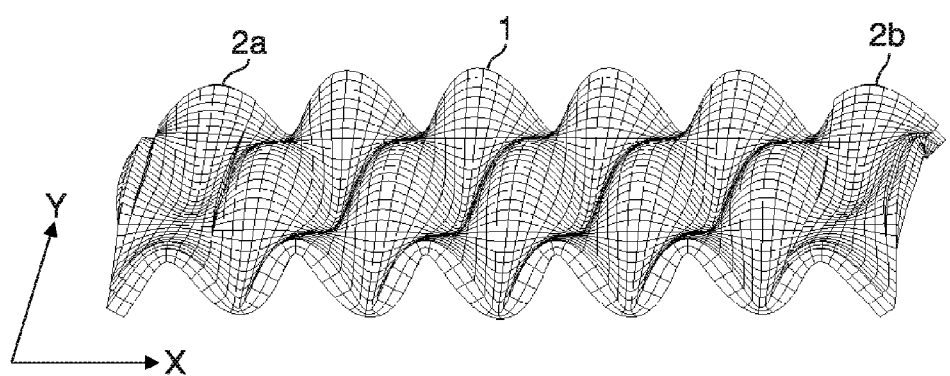

FIG. 2A is a perspective view showing the vibration body 3. FIG. 2B is a perspective view schematically showing the vibration in the vibration mode A. And, FIG. 2C is a perspective view showing the vibration in the vibration mode B. The vibration in the vibration mode A is an out-of-plane flexural vibration of a twelfth order in the X-direction (a first direction) and of a zero-order in the Y-direction (a second direction). The vibration in the vibration mode B is an out-of-plane flexural vibration of an eleventh order in the X-direction and of a first order in the Y-direction. That is, the order in the vibration mode A differs by one degree from the order in the vibration mode B in each of the X-direction and the Y-direction. When a total order in a certain vibration mode shall be represented by "[the order in the X-direction, the order in the Y-direction]", the total order in the vibration mode A is represented by "[12, 1]", and the total order in the vibration mode B is represented by "[11, 1]".

The alternation voltage Va is different from the alternation voltage Vb in a time phase. Accordingly, a vibration in which the two vibrations in the vibration modes A and B are composited is excited in the vibration body 3. When an absolute value of a difference between resonance frequencies in the vibration modes A and B is represented by $\Delta f$, it is preferable that $\Delta f$ become small as much as possible in order to use resonance phenomena effectively. That is, it is preferable that the resonance frequencies of the vibrations in the vibration modes A and B be close to each other. Specifically, when the larger resonance frequency between the resonance frequencies in the vibration modes A and B is represented by fr, it is preferable that a relationship between the resonance frequency fr and $\Delta f$ satisfy "$\Delta f < 0.1 \cdot fr$".

Moreover, it is also preferable that the total order in the vibration mode A is "[m+1, n−1]" (m and n are natural numbers) and the total order in the vibration mode B is "[m, n]" in order to reduce influence of an aspect ratio of the optical element 1. It is also preferable that the order in the vibration mode A in the Y-direction is zero like the above-mentioned order "[12, 0]" in order to minimize influence of a node.

When the vibrations in the vibration modes A and B of which the resonance frequencies are close are used and when the frequency of the alternation voltages Va and Vb (a drive frequency of the vibration body 3) is close to the resonance frequencies in the vibration modes A and B, large amplitude is obtained even if an applied voltage is low. Accordingly, dust, etc., adhered to the optical element 1 is efficiently removable from the optical element 1. It should be noted that the resonance frequencies in the vibration modes A and B can be independently controlled by adjusting the size of the optical element 1 in the X-direction and the Y-direction.

Figure 3:
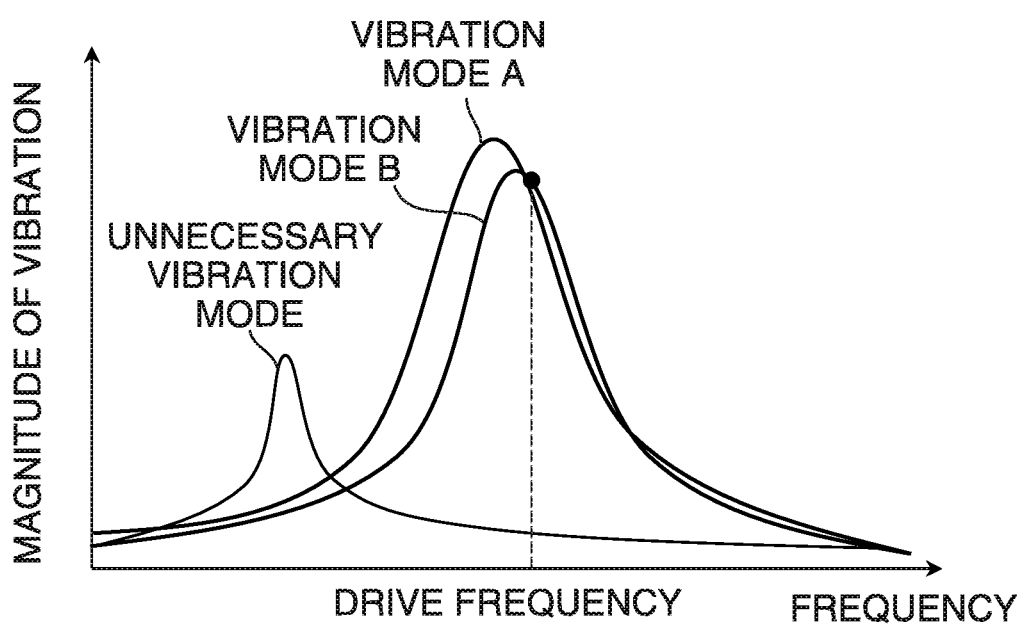
FIG. 3 is a graph showing a relation between resonance frequencies of vibrations excited in the vibration body in FIG. 2A in vibration modes for removing dust and a resonance frequency of a vibration in an unnecessary vibration mode.

FIG. 3 is a graph showing a relation between the resonance frequencies of vibrations excited in the vibration body 3 in the vibration modes A and B and a resonance frequency of a vibration in an unnecessary vibration mode. When the drive frequency is set in the vicinity of the resonance frequencies in the vibration modes A and B, influence of other unnecessary vibration modes is reduced.

Behavior of the composite vibration that is obtained by compositing the vibrations in the vibration modes A and B in a case where the vibrations in the second and third orders are composited in the X-direction will be described with reference to FIG. 4A through FIG. 4F and FIG. 5A through FIG. 5F. FIG. 4A through FIG. 4F are graphs in a first set each of which shows displacements of the vibrations excited in the vibration body 3 in the vibration modes A and B and a composite displacement of the vibrations with respect to a time phase. FIG. 5A through FIG. 5F are graphs in a second set each of which shows the displacements with respect to the time phase.

In FIG. 4A through FIG. 4F and FIG. 5A through FIG. 5F, a thin solid line indicates the displacement of the vibration in the vibration mode A, a broken line indicates the displacement of the vibration in the vibration mode B, and a thick solid line indicates the displacement of the composite vibration. More specifically, the thin solid line indicates the out-of-plane flexural vibration in the vibration mode A (the third order in the X-direction and the zero-order in the Y-direction) and the broken line indicates the out-of-plane flexural vibration in the vibration mode B (the second order in the X-direction and the first order in the Y-direction) in a case where the phase difference is 90 degrees and an amplitude ratio of the two vibrations becomes "1:1". Moreover, the thick solid line indicates a value that is obtained by normalizing displacements in the Z-direction caused by compositing the vibrations in the vibration modes A and B near the center of the vibration body 3 in the Y-direction. In FIG. 4A through FIG. 4F and FIG. 5A through FIG. 5F, a vertical axis denotes the displacement in the Z-direction and a horizontal axis denotes a position in the X-direction on the assumption that the length of the vibration body 3 in the X-direction is 360, and the vibrations at twelve time phases t that are obtained by equally dividing the period T of the vibrations into 12 are shown.

Figure 4A:
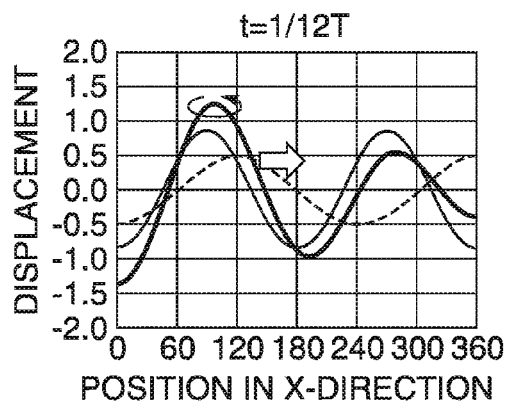
FIG. 4A through FIG. 4F are graphs in a first set each of which shows displacements of the vibrations excited in the vibration body in FIG. 2A in the two vibration modes for removing dust and a composite displacement of the vibrations with respect to a time phase.
Figure 4D:
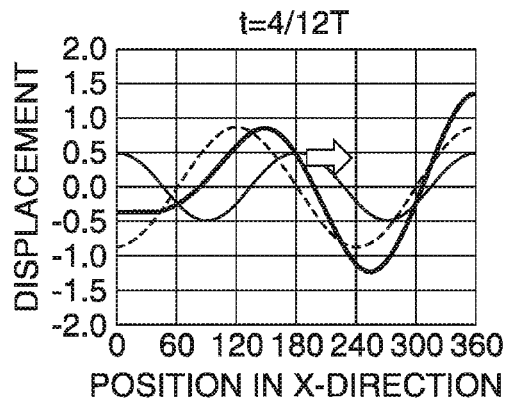
Figure 4B:
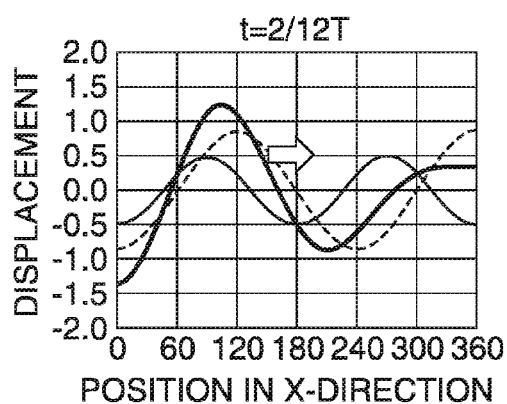
Figure 4E:
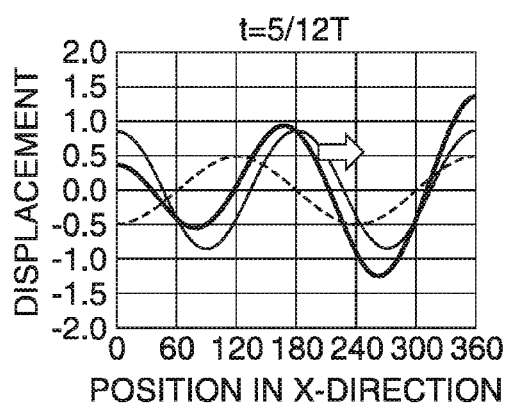
Figure 4C:
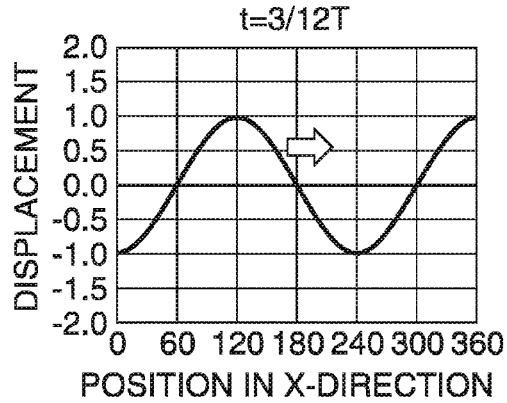
Figure 4F:
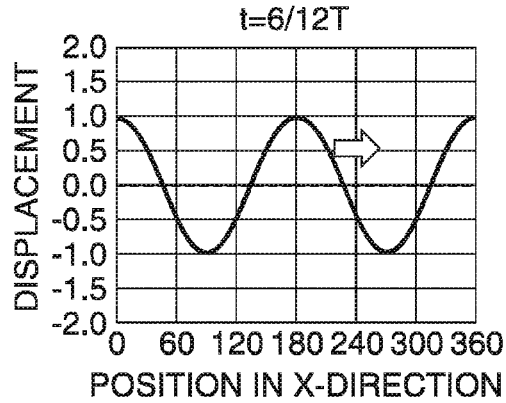
Figure 5A:
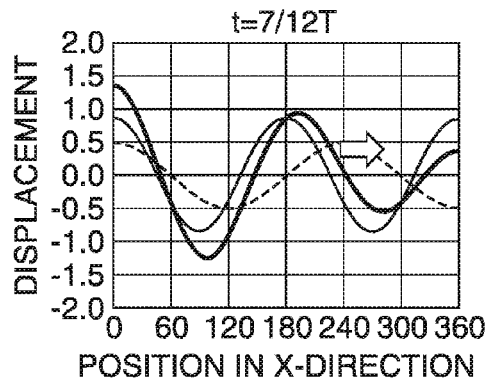
FIG. 5A through FIG. 5F are graphs in a second set each of which shows displacements of the vibrations excited in the vibration body in FIG. 2A in the two vibration modes for removing dust and a composite displacement of the vibrations with respect to a time phase.
Figure 5D:
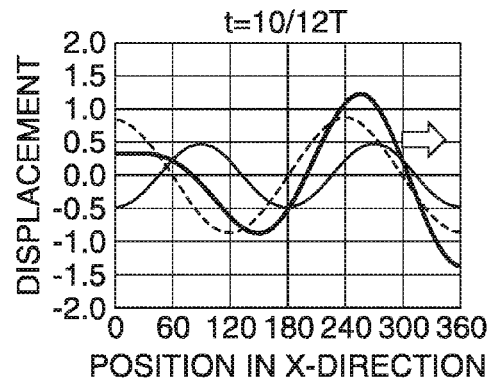
Figure 5B:
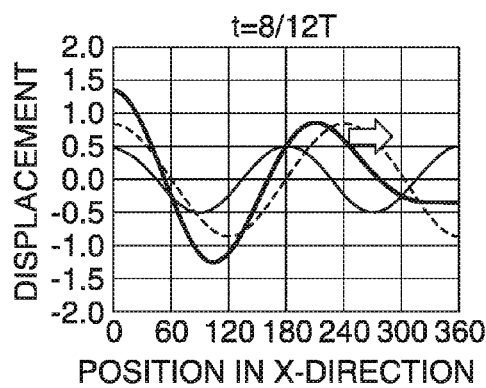
Figure 5E:
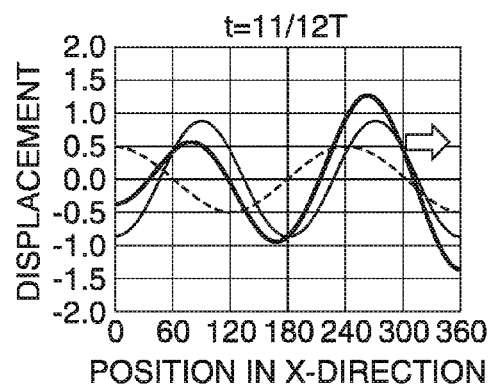
Figure 5C:
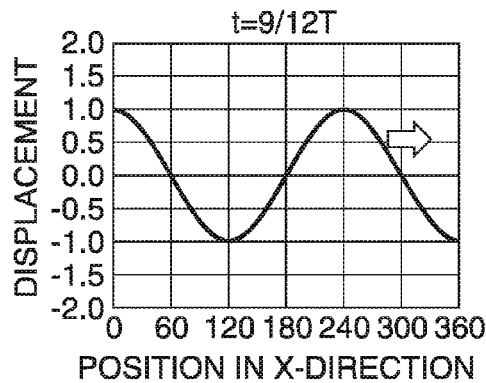
Figure 5F:
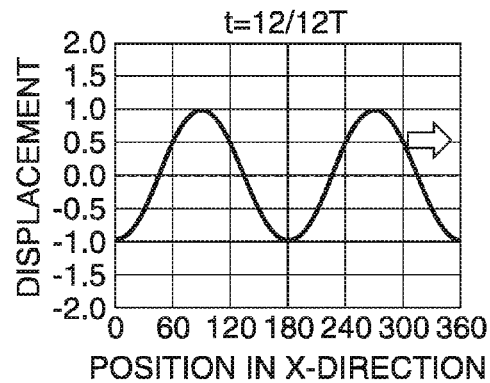

When the vibration body 3 is vibrated, a wave of the composite vibration travels in a direction of an arrow "a" shown in FIG. 4A. When focusing on one point of the wave of the composite vibration, an elliptic motion as indicated by an arrow "b" shown in FIG. 4A occurs in a Z-X plane in the optical element 1. Dust, etc., adhered on the front surface of the optical element 1 receives a force in a normal direction of the front surface of the optical element 1 by the composite vibration and moves by being flipped, when the optical element 1 pushes up the dust, etc., off of the surface (the positive direction of the vertical axis in FIG. 4A through FIG. 4F and FIG. 5A through FIG. 5F, i.e., the positive direction in the Z-direction).

It should be noted that the phase difference between the vibrations in the vibration modes A and B is not limited to 90 degrees, and may be any angles other than 0 degrees and 180 degrees. The amplitude ratio of the vibration modes A and B is not limited to "1:1". By adjusting the phase difference and the amplitude of the alternation voltages Va and Vb, the composite vibration is close to the traveling wave with little amplitude unevenness.

Since the composite vibration is closer to a stationary wave as a position is closer to the edge of the optical member 1 in the X-direction, it is preferable to set the order of the vibration mode so as not to generate the stationary wave in an effective area of the optical member 1 with respect to the image pickup device. The orders of the vibration modes A and B that generate the composite vibrations shown in FIG. 4A through FIG. 4F and FIG. 5A through FIG. 5F are set so that dust, etc., is efficiently removed from the effective area on the assumption that the effective area (an area through which a light flux that forms an image on the image pickup device transmits) of the optical element 1 with respect to the image pickup device is near the region from the position 60 to the position 300.

Moreover, since some of the node positions of the vibration in the vibration mode B in the Y-direction may overlap with the node positions of the vibration in the vibration mode A, the stationary wave occurs without generating the traveling wave as shown in FIG. 4A at the node positions of the vibration in the vibration mode B in the Y-direction, which deteriorates the performance of removing dust, etc. Accordingly, it is preferable to control the size of the optical element 1 in the Y-direction so that the node positions of the vibration in the vibration mode B in the Y-direction are positioned outside the effective area.

In order to direct all the traveling waves in a uniform direction, it is necessary to use two vibration modes of which orders in a direction of traveling waves to be generated are different by one. Accordingly, the total orders of the vibration modes excited in the vibration body 3 are not limited to the combination of "[3, 0]" and "[2, 1]" shown in FIG. 4A through FIG. 4F and FIG. 5A through FIG. 5F. For example, the combination of "[12, 0]" and "[11, 1]" shown in FIG. 2 may be used. In such a case, it is preferable to control the size of the optical element 1 in the Y-direction so that the node positions of the vibration in the vibration mode B in the Y-direction are positioned outside the effective area, as mentioned above.

As mentioned above, since the vibration driving device according to the embodiment enables the driving using the resonance phenomena by making the resonance frequencies in the two vibration modes excited in the vibration body 3 coincide approximately, the vibrations are efficiently excited by a low voltage without being influenced by an unnecessary vibration mode. Accordingly, when the vibration body 3 is applied to the dust removing device 10, efficient dust removing becomes possible.

It should be noted that the order is defined as a value obtained by subtracting 1 from the number of nodes in the vibration mode, and the order in the case where the number of nodes is 0 is even defined as zero-order in this embodiment for simplification. Moreover, although the embodiment is described using the orders of the vibration modes, it is also achievable by replacing the orders with the number of nodes. When the number of nodes, which is not particularly defined by the order, is "1", it is possible to cause a traveling wave in a case where the numbers of nodes are "[12, 0]" and [11, 1], for example.

Next, a second embodiment of the present invention will be described. The first embodiment describes the dust removing device 10 that removes particles, such as dust, adhered to the optical element 1 by exciting the vibrations in the optical element 1 with the two piezoelectric devices 2a and 2b. Against this, the second embodiment describes a dust removing device that removes particles, such as dust, adhered to an optical element by exciting a vibration in the optical element with a single piezoelectric device (an electro-mechanical energy conversion element).

Figure 6:
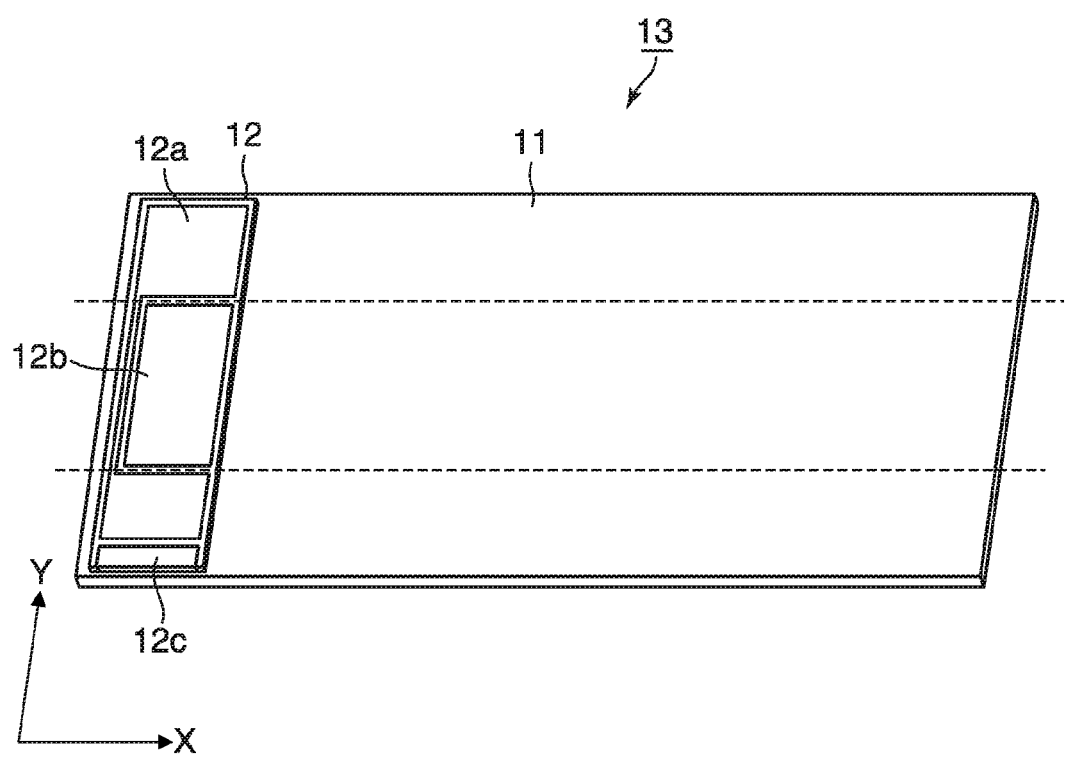
FIG. 6 is a perspective view schematically showing a configuration of a vibration body used in a dust removing device according to a second embodiment of the present invention.

FIG. 6 is a perspective view schematically showing a configuration of a vibration body 13 used in the dust removing device according to the second embodiment of the present invention. It should be noted that the dust removing device according to the second embodiment has a configuration in which the vibration body 3 of the dust removing device 10 is replaced with the vibration body 13. Accordingly, descriptions about constructional elements other than the vibration body 13 are omitted.

The vibration body 13 is constituted by joining a piezoelectric device 12 to one of end portions of an optical element 11 in the X-direction by adhesion, etc. The piezoelectric device 12 is constituted by forming two first electrodes 12a, a second electrode 12b, and a folded electrode 12c on a first side of a piezoelectric substance. An alternation voltage Va and an alternation voltage Vb are respectively applied to the first electrodes 12a and the second electrode 12b through the flexible printed circuit board (not shown). The folded electrode 12c is in electrical conduction with a whole-surface electrode (not shown) disposed on a second side opposite to the first side through a side electrode disposed on a side of the piezoelectric substance, and is connected to ground.

It should be noted that the first electrodes 12a are formed on the first side of the piezoelectric substance at a predetermined interval in a second direction (the Y-direction) that intersects perpendicularly with a first direction (the X-direction). In this embodiment, the two first electrodes 12a are electrically connected through an electrode pattern in the Y-direction on the front surface of the optical element 11 as shown in FIG. 6. However, the two first electrodes 12a may be formed independently.

Broken lines in FIG. 6 show node positions of a vibration in the vibration mode B in the Y-direction. Then, a non-electrode part that extends in the X-direction between the first electrodes 12a and the second electrode 12b in order to isolate the first electrodes 12a and the second electrode 12b in the Y-direction includes these node positions. Since the phase of the vibration in the vibration mode B in the regions of the first electrodes 12a is opposite to the phase of the vibration in the vibration mode B in the region of the second electrode 12b across the node positions in the Y-direction, the vibration in the vibration mode B is excited efficiently by setting the phase difference between the alternation voltages Va and Vb to 180 degrees. On the contrary, since the phase of the vibration in the vibration mode A is common in the regions of the first electrodes 12a and the region of the second electrode 12b, the vibration is excited efficiently by setting the phase difference between the alternation voltages Va and Vb to 0 degrees. Accordingly, when the phase difference between the alternation voltages Va and Vb is set to an angle other than 0 degrees and 180 degrees, and is preferably set to 90 degrees, the composite vibration (traveling wave) described with reference to FIG. 4A through FIG. 4F and FIG. 5A through FIG. 5F is excited.

As mentioned above, the second embodiment enables the optical element 11 to excite a desired vibration with the piezoelectric device 12 solely. This miniaturizes the optical element 11 as compared with the optical element 1 to which the two piezoelectric devices 2a and 2b are joined, and reduces the number of the parts for supplying electric power to the piezoelectric device, which reduces the cost. Furthermore, the vibration body 13 according to the second embodiment removes dust, etc., adhered to the optical element 11 efficiently by a low voltage without being influenced by an unnecessary vibration mode as with the vibration body 3 of the first embodiment.

Next, a third embodiment of the present invention will be described. The first embodiment and the second embodiment describe the cases where the vibration driving device is applied to the dust removing device. The third embodiment will describe a vibration driving device that relatively moves a vibration body and a driven body by making the driven body contact with the vibration body while giving pressure and by exciting a predetermined vibration in the vibration body. It should be noted that the vibration driving device according to the third embodiment is defined as a device including the driven body.

Figure 7A:
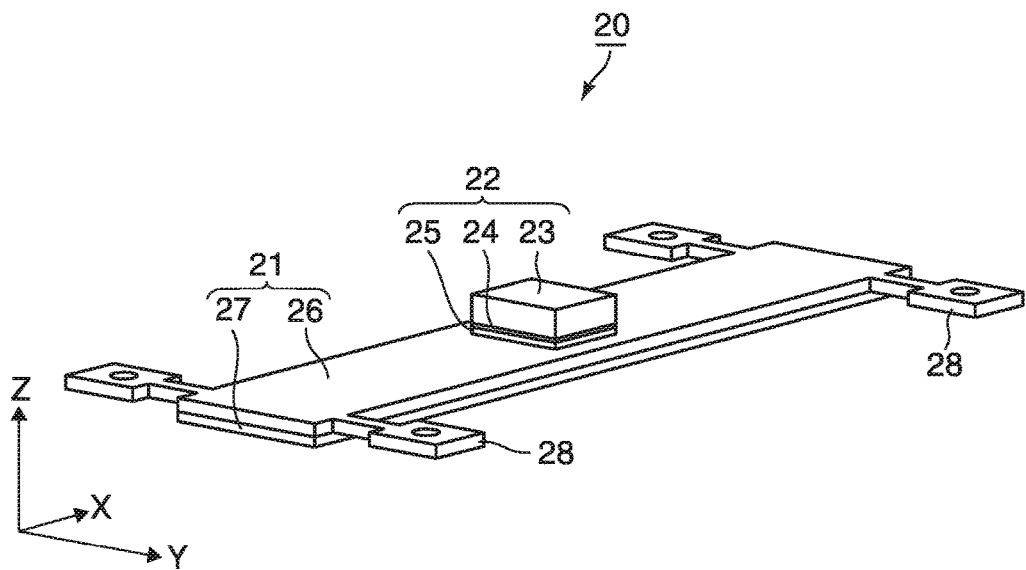
FIG. 7A is a perspective view schematically showing a configuration of a vibration driving device according to a third embodiment of the present invention.

FIG. 7A is a perspective view schematically showing a configuration of the vibration driving device 20 according to the third embodiment of the present invention. The vibration driving device 20 is provided with the vibration body 21 and a slider 22 as the driven body. The vibration body 21 is provided with an elastic body 26, a piezoelectric device 27 joined to a first side of the elastic body 26, and a support member 28 for fixing the elastic body 26 to a base (not shown). The slider 22 is held by a pressurizing member (not shown) in a state where the slider 22 contacts with a second side (the side opposite to the first side on which the piezoelectric device 27 is joined) of the vibration body 21 while giving pressure thereto.

The slider 22 has a slider base 23 of an angle rod form made from magnet material, a spring member 24, and a friction member 25. The friction member 25 frictionally slides relative to the vibration body 21. Accordingly, the friction member 25 is made from material having a high friction coefficient and friction durability. For example, martensite stainless steel SUS420J2 of which a surface is subjected to a nitriding treatment, or ceramics like alumina is used. The magnetic material that constitutes the slider base 23 forms a magnetic circuit by collaborating with ferromagnetic SUS440C that constitutes the elastic body 26.

The spring member 24 is fixed between the friction member 25 and the slider base 23. The spring member 24 is made from sheet material with comparatively low rigidity. Specifically, polyimide, PET, fluoro-resin, silicone rubber, etc., are used. The slider 22 smoothly follows a vibration of the vibration body 21 because a proper spring property is given by the spring member 24.

The support member 28 is disposed in the X-direction of the elastic body 26. The support member 28 may be formed integrally with the elastic body 26 by press working, etc., or may be joined by laser welding, etc. Movement of the elastic body 26 is regulated because the support member 28 is fixed to the base. When the support member 28 is disposed at a position of a node of the vibration excited in the vibration body 21 (the elastic body 26), the prevention of the vibration that is excited in the elastic body 26 is minimized.

In the vibration body 21, the piezoelectric device 27 may be fixed to the elastic body 26 with adhesive, or may be formed by a well-known thick film printing method and integrated with the elastic body 26 by baking simultaneously with the elastic body 26. When the thick film printing method is used, it is preferable to form the piezoelectric device 27 after forming a connecting layer constituted by ceramics, etc., on the elastic body 26 in order to prevent diffusion of components (component elements of stainless steel) of the elastic body 26 to the piezoelectric device 27. Moreover, the use of the thick film printing method enables the piezoelectric device 27 to be 100 micrometers or less. This prevents the resonance frequency from being excessively raised, prevents a neutral surface from going into the side of the piezoelectric device 27, and prevents the periodic damping due to the adhesive from increasing when the elastic body 26 is miniaturized and slimmed down. Furthermore, since the amplitude of the vibration that can be excited becomes large when the thickness of the vibration body 21 becomes thin, it becomes possible to move the slider 22 at high speed without forming projecting portions on the sliding surface of the elastic body 26 with respect to the slider 22.

Figure 7B:
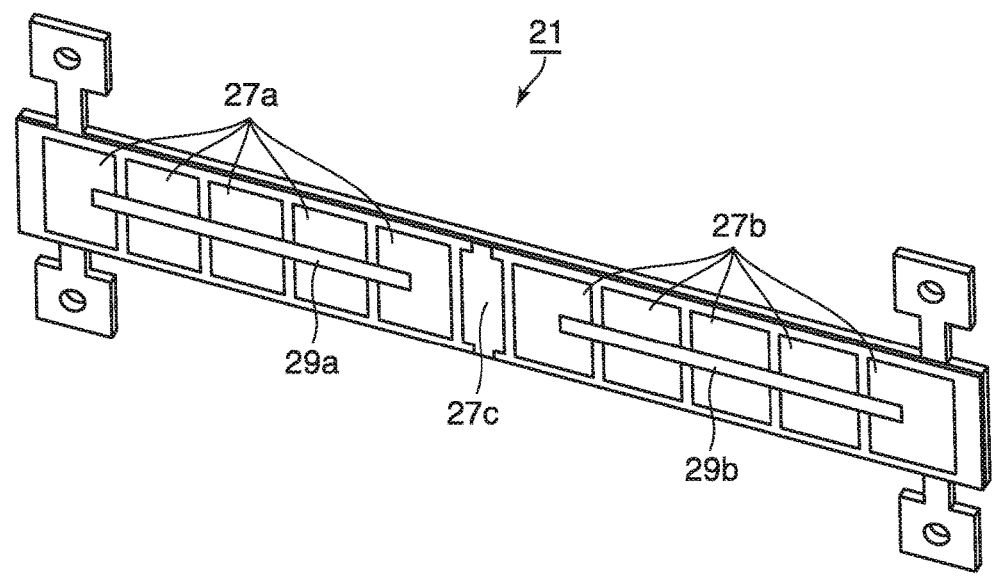
FIG. 7B is a perspective view showing a vibration body of the vibration driving device shown in FIG. 7A.

FIG. 7B is a perspective view of the vibration body 21 and shows a configuration of the piezoelectric device 27 that mainly constitutes the back side of the vibration body 21. First electrodes 27a, second electrodes 27b, and a folded electrode 27c are formed on an exposed side (the side opposite to the joined side to the elastic body 26) of the piezoelectric device 27. A whole-surface electrode (not shown) is formed on the joined side (the side opposite to the exposed side) to the elastic body 26 of the piezoelectric device 27. The whole-surface electrode is electrically connected with the folded electrode 27c through a through hole electrode or a side electrode (not shown) provided in the piezoelectric device 27, and is further connected to ground through a flexible printed circuit board (not shown).

Polarization directions of adjacent electrodes among the five first electrodes 27a are inverted mutually, and non-electrode parts between the adjacent first electrodes 27a include node positions in the vibration mode A. Accordingly, the vibration in the vibration mode A can be excited efficiently. Similarly, polarization directions of adjacent electrodes among the five second electrodes 27b are inverted mutually, and non-electrode parts between the adjacent second electrodes 27b include node positions in the vibration mode B. Accordingly, the vibration in the vibration mode B can be excited efficiently.

The five first electrodes 27a are in electrical conduction with one another through a first link electrode 29a after a poling process. And the five second electrodes 27b are in electrical conduction with one another through a second link electrode 29b after the poling process. It should be noted that the number of the first electrodes 27a and the number of the second electrodes 27b may be changed according to the orders in the vibration modes A and B, and are not limited to five.

The vibration in the total order of "[12, 0]" is used in the vibration mode A, and the vibration in the total order of "[11, 1]" is used in the vibration mode B. When the alternation voltages between which the phase difference is 90 degrees are applied to the first electrodes 27a and the second electrodes 27b through the flexible printed circuit board (not shown), the composite vibration (traveling wave) described with reference to FIG. 4A through FIG. 4F and FIG. 5A through FIG. 5F is excited as with the first embodiment.

When focusing on one point of the wave of the composite vibration, an elliptic motion as indicated by the arrow "b" shown in FIG. 4A occurs in the Z-X plane in the elastic body 26. Accordingly, the slider 22 that contacts with the elastic body 26 while giving pressure receives friction drive force (thrust) from the elastic body 26, and moves in the direction of the elliptic motion (the direction opposite to the traveling direction of the traveling wave).

Since the magnitude of the vibration (amplitude) that occurs in the vibration body 21 varies by controlling the frequency of the alternation voltages applied to the first electrodes 27a and the second electrodes 27b, the movement speed of the slider 22 is adjustable. Moreover, the ratio between the displacement in the X-direction and the displacement in the Z-direction of the elliptic motion occurred by the elastic body 26 is changeable by controlling the phase difference, the amplitude ratio, and the frequency of the alternation voltages applied to the first electrodes 27a and the second electrodes 27b. Accordingly, when it is controlled to enlarge the displacement in the Z-direction enough, the movement of the slider 22 in a low speed region is stabilized. When projecting portions, which are disclosed in Japanese Patent Publication No. 2625555, are formed on the sliding surface of the elastic body 26 with respect to the slider 22, the maximum movement speed of the slider 22 increases.

As mentioned above, the third embodiment achieves the vibration driving device of which the adjustable range (dynamic range) of the movement speed of the slider 22 is wide. Moreover, the vibration driving device according to the third embodiment is easy to miniaturize because the configuration of the vibration body 21 is simple. Moreover, a cost reduction is achieved because manufacture becomes easy.

Next, a fourth embodiment of the present invention will be described. In the third embodiment, the vibration body 21 is fixed and the slider 22 is relatively moved with respect to the vibration body 21. In the fourth embodiment, an example of a configuration in which a vibration body moves with respect to a driven body will be described.

Figure 8:
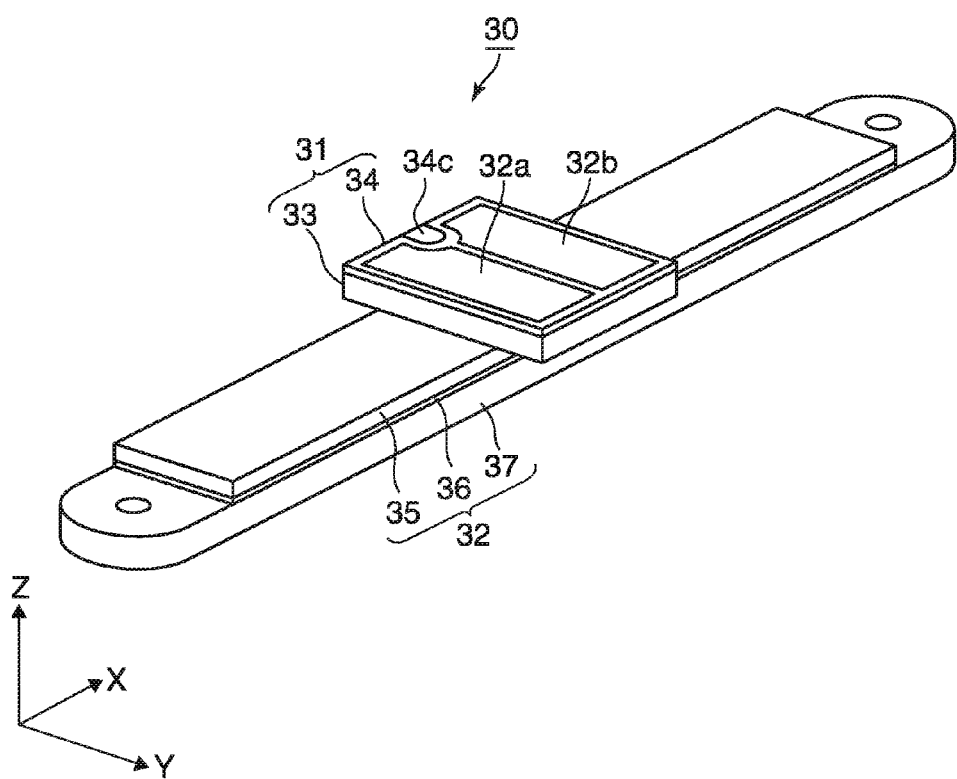
FIG. 8 is a perspective view schematically showing a configuration of a vibration driving device according to a fourth embodiment of the present invention.

FIG. 8 is a perspective view schematically showing a configuration of a vibration driving device 30 according to the fourth embodiment of the present invention. The vibration driving device 30 is provided with a vibration body 31 and a driven body 32. The vibration body 31 has an elastic body 33 and a piezoelectric device 34. The driven body 32 is constituted by a friction member 35, a spring member 36, and a base 37. Although the shapes of the friction member 35, the spring member 36, and the base 37 are respectively different from the shapes of the friction member 25, the spring member 24, and the slider base 23 that constitute the slider 22 described in the third embodiment, the materials, etc., used are identical. Accordingly, their descriptions are omitted. It should be noted that a motion of the driven body 32 is regulated because the base 37 is fixed to a mounting base (not shown) at both ends in the X-direction.

A first electrode 34a, a second electrode 34b, and a folded electrode 34c are formed on the piezoelectric device 34. The functions of the first electrode 34a, the second electrode 34b, and the folded electrode 34c are equivalent to the functions of the first electrodes 27a, the second electrodes 27b, and the folded electrode 27c that are described in the third embodiment, and the applying method of the alternation voltages is also the same. Accordingly, when the vibrations in the vibration modes A and B are excited in the vibration body 31, the vibration body 31 itself moves in the X-direction. It should be noted that the vibrations of the lowest total orders of "[2, 0]" and "[1, 1]" may be respectively used in the vibration modes A and B in order to take a large moving stroke in the X-direction.

Figure 9:
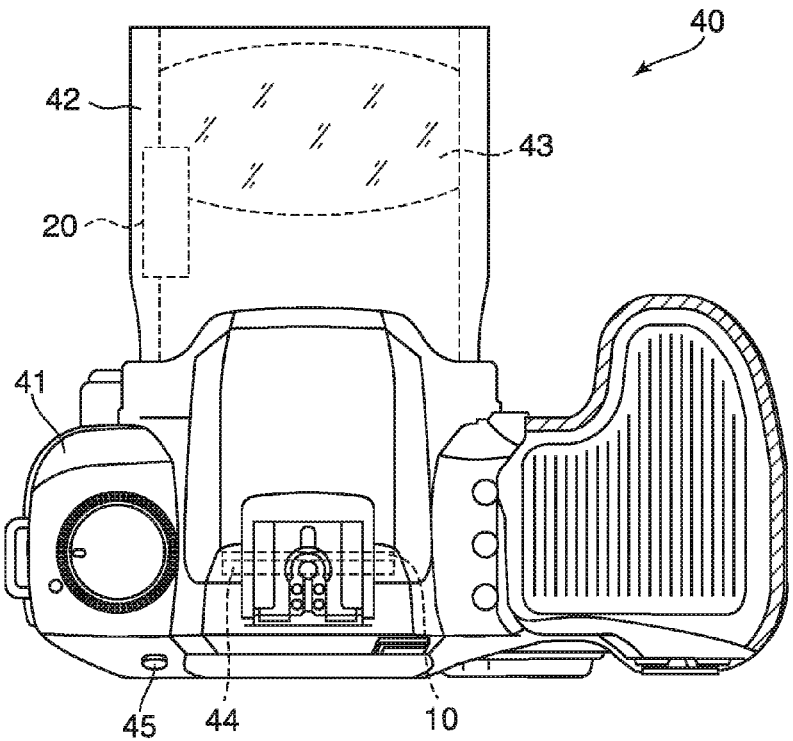
FIG. 9 is a view schematically showing a configuration of an image pickup apparatus equipped with the dust removing device and the vibration driving device according to the embodiments of the present invention.
Figure 10:
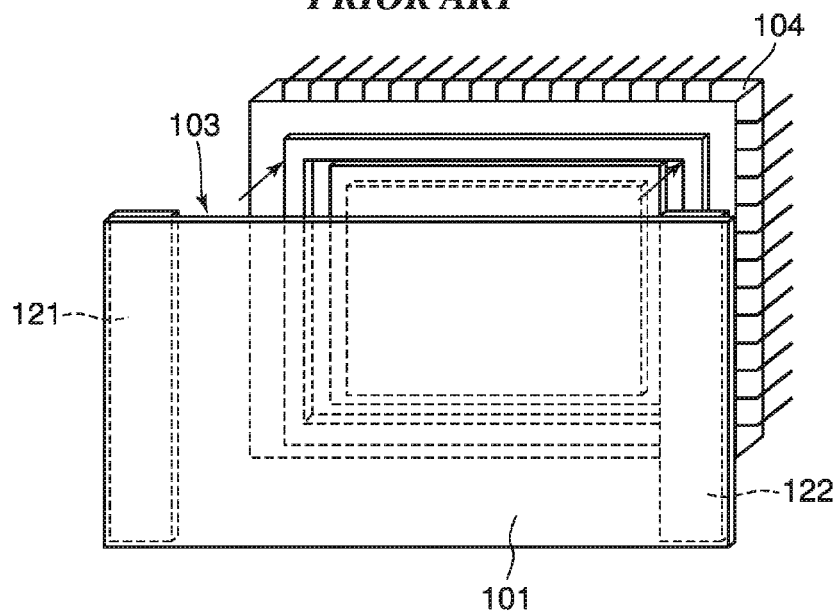
FIG. 10 is a perspective view schematically showing a configuration of a conventional dust removing device.

Next, a fifth embodiment of the present invention will be described. The fifth embodiment describes an image pickup apparatus 40 equipped with the dust removing device 10 according to the first embodiment and the vibration driving device 20 according to the third embodiment. FIG. 9 is a view schematically showing a configuration of the image pickup apparatus 40. The image pickup apparatus 40 is what is called a single-lens reflex camera in which a lens barrel 42 is detachable to a camera body 41. The lens barrel 42 contains a lens group 43 that consists of a plurality of lenses, such as a focus lens and a zoom lens.

An image pickup device 44 is arranged inside the camera body 41, and the dust removing device 10 is arranged at the front side of the image pickup device 44. Moreover, a drive switch 45 for the dust removing device 10 is provided in the external rear face of the camera body 41. When the drive switch 45 is pressed, a control unit (a control circuit, not shown) provided in the camera body 41 transmits a drive command signal to the control circuit 6 (not shown in FIG. 9) of the dust removing device 10, and the control circuit 6 drives the dust removing device 10.

The vibration driving device 20 is arranged inside the lens barrel 42. The vibration driving device 20 is arranged so that the slider 22 is movable in the optical axis direction. The slider 22 is connected to a lens-holding member (not shown) that holds the focus lens. Accordingly, an automatic focusing operation is performed by adjusting a position of the focus lens in the optical axis direction by moving the slider 22 in the optical axis direction by exciting the vibrations in the vibration modes A and B in the vibration body 21.

It should be noted that the vibration driving device 20 may be used for a power zooming mechanism that moves a zoom lens in the optical axis direction. Moreover, the image pickup apparatus is not limited to a digital camera, but may be an exchange type lens unit, a video camera, a surveillance camera, a camera for broadcast, a camera in mobile computing devices, etc.

Although the embodiments of the invention have been described, the present invention is not limited to the above-mentioned embodiments, and can include various modifications as long as the concept of the invention is not deviated. The above-mentioned embodiments describe the example in which the vibration body according to the present invention is applied to the vibration driving device and the vibration driving device is applied to the lens barrel that moves the lens in the optical axis direction. However, the present invention is not limited to such an application. For example, the vibration driving device equipped with the vibration body according to the present invention may be applied to an image stabilization mechanism that moves a lens or an image pickup device that corrects an image blur in a direction intersecting perpendicularly with an optical axis.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-035106, filed Feb. 25, 2015, which is hereby incorporated by reference herein in its entirety.

What is claimed is:

1. A vibration driving device comprising:
a vibration body configured to have a plate-like elastic body and a first electro-mechanical energy conversion element that is joined to the elastic body; and
a control unit configured to excite a vibration in a first vibration mode and a vibration in a second vibration mode in said vibration body by applying alternation voltages to the first electro-mechanical energy conversion element, orders or numbers of nodes of the vibrations in the first and second modes in a first direction that intersects perpendicularly with a thickness direction of the elastic body being mutually different by one, and orders or numbers of nodes of the vibrations in the first and second modes in a second direction that intersects perpendicularly with the thickness direction of the elastic body and the first direction being mutually different by one.

2. The vibration driving device according to claim 1, wherein the first electro-mechanical energy conversion element has a piezoelectric substance, two first electrodes formed on the piezoelectric substance at an interval in the second direction, and a second electrode formed on the piezoelectric substance between the two first electrodes, and
wherein said control unit applies alternation voltages of which temporal phase difference is other than 0 degrees and 180 degrees to the first electrodes and the second electrode, respectively.

3. The vibration driving device according to claim 2, wherein said vibration body includes non-electrode parts that are formed at positions of nodes in the second vibration mode in the second direction in order to isolate the two first electrodes and the second electrode.

4. The vibration driving device according to claim 1, wherein said vibration body is provided with a second electro-mechanical energy conversion element that is joined to the elastic body at a predetermined interval in the first direction with respect to the first electro-mechanical energy conversion element.

5. The vibration driving device according to claim 4, wherein said control unit applies alternation voltages of which temporal phase difference is other than 0 degrees and 180 degrees to the first electro-mechanical energy conversion element and the second electro-mechanical energy conversion element, respectively.

6. The vibration driving device according to claim 1, wherein said control unit excites the vibration in the first vibration mode represented by "[m+1, n−1]" and the vibration in the second vibration mode represented by "[m, n]" in said vibration body,
where m and n are natural numbers, and the orders or the numbers of nodes in a certain vibration mode are represented by "[the order or the number of nodes in the first direction, the order or the number of nodes in the second direction]".

7. The vibration driving device according to claim 6, wherein said control unit excites the vibration of which the order or the number of nodes in the second direction is zero in said vibration body in the first vibration mode.

8. A vibration driving device comprising:
a vibration body configured to have a plate-like elastic body and an electro-mechanical energy conversion element that is joined to the elastic body; and
a control unit configured to excite a vibration in a first vibration mode and a vibration in a second vibration mode in said vibration body by applying alternation voltages to the electro-mechanical energy conversion element, orders or numbers of nodes of the vibrations in the first and second modes in a first direction that intersects perpendicularly with a thickness direction of the elastic body being mutually different by one, and orders or numbers of nodes of the vibrations in the first and second modes in a second direction that intersects perpendicularly with the thickness direction of the elastic body and the first direction being mutually different by one,
wherein the following relationship is satisfied:

$$\Delta f < 0.1 \cdot fr,$$

where $fr$ is the higher resonance frequency between the resonance frequencies in the first and second vibration modes, and $\Delta f$ is an absolute value of a difference between the resonance frequencies in the first and second vibration modes.

9. A driving method for a vibration body having a plate-like elastic body and an electro-mechanical energy conversion element that is joined to the elastic body, the driving method comprising:
a step of exciting a vibration in a first vibration mode and a vibration in a second vibration mode in the vibration body by applying alternation voltages to the electro-mechanical energy conversion element, orders or numbers of nodes of the vibrations in the first and second modes in a first direction that intersects perpendicularly with a thickness direction of the elastic body being mutually different by one, and orders or numbers of the nodes of the vibrations in the first and second modes in a second direction that intersects perpendicularly with the thickness direction of the elastic body and the first direction being mutually different by one.

10. An image pickup apparatus comprising:
a lens barrel in which a lens group is arranged; and
a vibration driving device that moves said lens group in an optical axis direction of said lens barrel,
wherein said vibration driving device comprises:
- a vibration body that has a plate-like elastic body and an electro-mechanical energy conversion element that is joined to the elastic body,
- a driven body that is frictionally driven by vibrations excited in the vibration body, and
- a control unit configured to excite a vibration in a first vibration mode and a vibration in a second vibration mode in the vibration body by applying alternation voltages to the electro-mechanical energy conversion element, orders or numbers of nodes of the vibrations in the first and second modes in a first direction that intersects perpendicularly with a thickness direction of the elastic body being mutually different by one, and orders or numbers of the nodes of the vibrations in the first and second modes in a second direction that intersects perpendicularly with the thickness direction of the elastic body and the first direction being mutually different by one, wherein the lens group moves in the optical axis direction according to relative movement of the vibration body and the driven body that occurs by exciting the vibration in the first vibration mode and the vibration in the second vibration mode in the vibration body.

11. An image pickup apparatus comprising:
an image pickup device; and
a dust removing device,
wherein said dust removing device comprises:
- a vibration body that has a plate-like optical element arranged in front of said image pickup device, and an electro-mechanical energy conversion element joined to a first side of the optical element, and
- a control unit configured to excite a vibration in a first vibration mode and a vibration in a second vibration mode in the vibration body by applying alternation voltages to the electro-mechanical energy conversion element in order to remove dust adhered on a front side of the optical element, orders or numbers of nodes of the vibrations in the first and second modes in a first direction that intersects perpendicularly with a thickness direction of the optical element being mutually different by one, and orders or numbers of nodes of the vibrations in the first and second modes in a second direction that intersects perpendicularly with the thickness direction of the optical element and the first direction being mutually different by one, wherein the node positions in the second vibration mode are positioned outside an area through which a light flux that forms an image on said image pickup device transmits.

\* \* \* \* \*